(12) United States Patent
Lin et al.

(10) Patent No.: US 10,043,888 B2
(45) Date of Patent: Aug. 7, 2018

(54) METHOD FOR FORMING A SEMICONDUCTOR STRUCTURE

(71) Applicant: UNITED MICROELECTRONICS CORP., Hsinchu (TW)

(72) Inventors: Yi-Hui Lin, Changhua County (TW); Keng-Jen Lin, Kaohsiung (TW); Yu-Ren Wang, Tainan (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 15/391,048

(22) Filed: Dec. 27, 2016

(65) Prior Publication Data

US 2018/0182862 A1   Jun. 28, 2018

(51) Int. Cl.

| H01L 29/66 | (2006.01) |
| H01L 21/762 | (2006.01) |
| H01L 21/3205 | (2006.01) |
| H01L 21/321 | (2006.01) |
| H01L 21/3213 | (2006.01) |
| H01L 29/78 | (2006.01) |
| H01L 21/8234 | (2006.01) |

(52) U.S. Cl.
CPC ...... *H01L 29/66545* (2013.01); *H01L 21/321* (2013.01); *H01L 21/32055* (2013.01); *H01L 21/32135* (2013.01); *H01L 21/76224* (2013.01); *H01L 21/823481* (2013.01); *H01L 29/66795* (2013.01); *H01L 29/785* (2013.01)

(58) Field of Classification Search
CPC .......... H01L 29/66795; H01L 29/0924; H01L 29/785; H01L 29/823821; H01L 29/41791; H01L 29/66545; H01L 29/7855; H01L 29/7856; H01L 21/32055; H01L 21/321; H01L 21/32135; H01L 2029/7858; H01L 21/823821; H01L 21/823481; H01L 27/0924
See application file for complete search history.

(56) References Cited

U.S. PATENT DOCUMENTS

| 6,143,620 A * | 11/2000 | Sharan .................... H01L 28/84 257/E21.013 |
| 6,653,699 B1 * | 11/2003 | Yang .................. H01L 21/28035 257/315 |
| 7,989,856 B2 * | 8/2011 | Goto .................... H01L 29/785 257/288 |
| 9,214,358 B1 | 12/2015 | Lin et al. |
| 2015/0162419 A1 * | 6/2015 | Li ..................... H01L 29/66545 438/585 |
| 2015/0200111 A1 | 7/2015 | Muralidharan et al. |

* cited by examiner

*Primary Examiner* — Michael Trinh
(74) *Attorney, Agent, or Firm* — WPAT, PC

(57) ABSTRACT

A method for forming a semiconductor structure includes the following steps. First, a preliminary structure is provided. The preliminary structure includes a substrate and a plurality of fins formed on the substrate. Then, a first polysilicon layer is formed on the substrate. The first polysilicon layer covers at least portions of the fins. An amorphous silicon layer is formed on the first polysilicon layer.

13 Claims, 5 Drawing Sheets

US 10,043,888 B2

METHOD FOR FORMING A SEMICONDUCTOR STRUCTURE

TECHNICAL FIELD

The disclosure relates to a method for forming a semiconductor structure. More particularly, the disclosure relates to a method for forming a semiconductor structure comprising fins.

BACKGROUND

Semiconductor devices have been developed in a trend of decreasing the sizes. Nowadays, the technology node has been developed to 22 nm, 14 nm, and even smaller. One approach to manufacture such a small semiconductor device is FinFET technology. A plurality of fins are disposed in a high density. Each fin comprises a source and a drain, and is surrounded by a gate. By such a structure, the gate can control the transistor more efficiently. Replacement metal gate technology has been used to further improve the efficiency of the semiconductor devices. In a replacement metal gate process, a dummy polysilicon gate may be formed and removed in a following step. However, since the fins typically have a high aspect ratio and are separated from each other by a small space, it may be difficult to completely remove a material from or fill a material into the trenches between the fins or the trenches between the fins and adjacent structural features.

SUMMARY

This disclosure is directed to a method for forming a semiconductor structure comprising fins. The method is particularly beneficial for the removal of a silicon material from some portions of the trenches between the fins or the trenches between the fins and adjacent structural features.

According to some embodiments, the method comprises the following steps. First, a preliminary structure is provided. The preliminary structure comprises a substrate and a plurality of fins formed on the substrate. Then, a first polysilicon layer is formed on the substrate. The first polysilicon layer covers at least portions of the fins. An amorphous silicon layer is formed on the first polysilicon layer.

Figure 1:
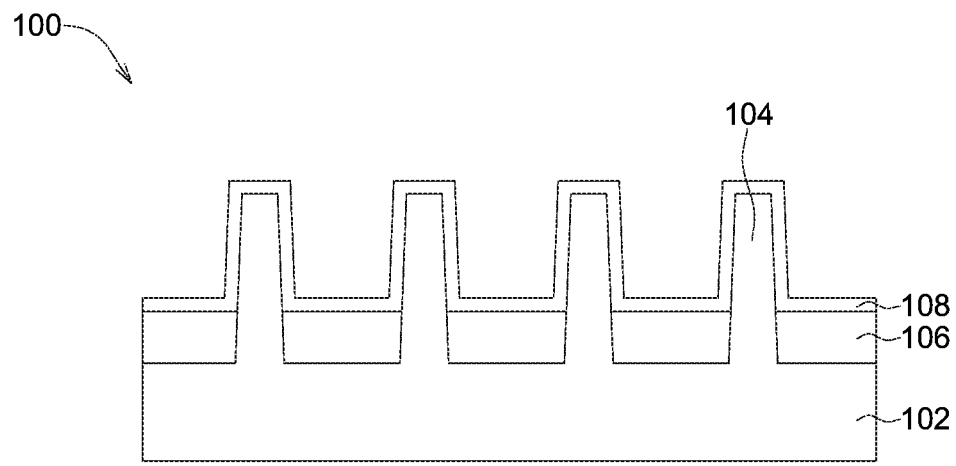
FIGS. 1-8 illustrate a semiconductor structure at various stages of fabrication according to embodiments.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

A method for forming a semiconductor structure according to embodiments will be described more fully hereinafter with reference to accompanying drawings. For clarity, the elements in the figures may not be drawn to scale. Further, in some figures, undiscussed components may be omitted. It is contemplated that the elements and features of one embodiment may be beneficially incorporated into another embodiment without further recitation.

The method at least comprises the following steps. First, a preliminary structure is provided. The preliminary structure comprises a substrate and a plurality of fins formed on the substrate. Then, a first polysilicon layer is formed on the substrate. The first polysilicon layer covers at least portions of the fins. An amorphous silicon layer is formed on the first polysilicon layer.

An exemplary preliminary structure 100 is shown in FIG. 1. The preliminary structure 100 comprises a substrate 102 and a plurality of fins 104 formed on the substrate 102. The preliminary structure 100 may further comprise shallow trench isolation (STI) structures 106 between the fins. In some embodiments, the preliminary structure 100 further comprises a spacer layer 108 conformally formed on the fins 104 and the STI structures 106. The spacer layer 108 may be formed of oxide.

Figure 2:
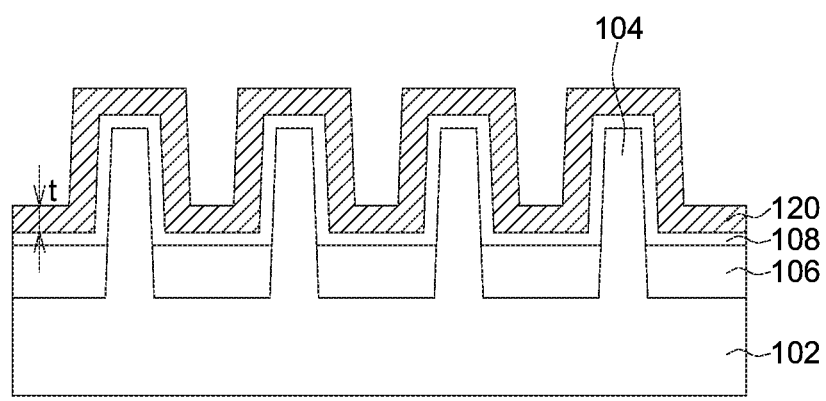

Referring to FIG. 2, a first polysilicon layer 120 is formed on the substrate 102. The first polysilicon layer 120 covers at least portions of the fins 104. In some embodiments, the first polysilicon layer 120 may be conformally formed on the fins 104 (and the spacer layer 108) and completely cover the fins 104, as shown in FIG. 2. According to some embodiments, the first polysilicon layer 120 may have a thickness t of 300 Å to 600 Å, such as 300 Å. In particular, the thickness t of 300 Å to 600 Å may be a thickness in a vertical direction calculated from the interface with the underlying layer, such as the spacer layer 108 in FIG. 2.

Figure 3:
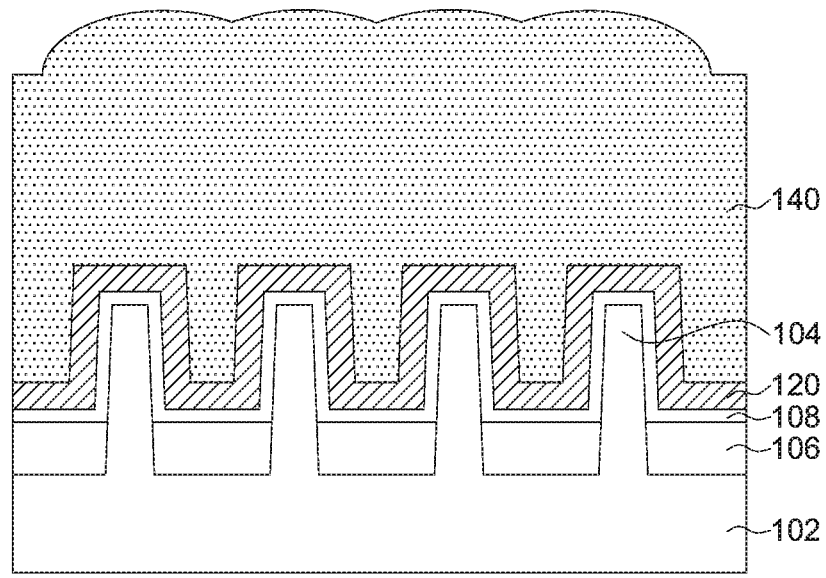
Figure 4:
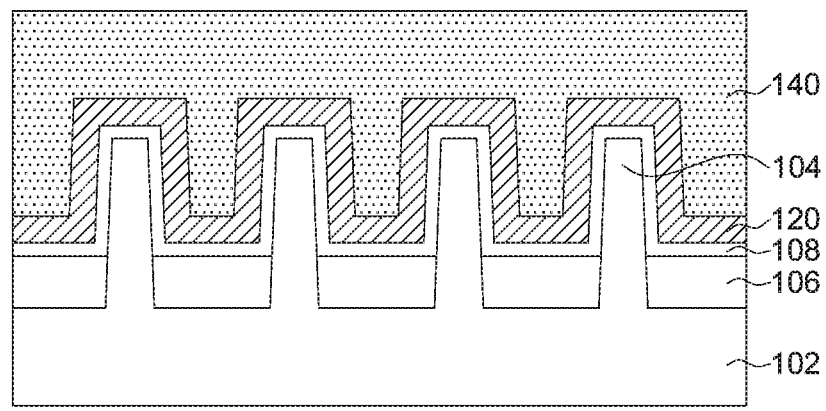

Referring to FIG. 3, an amorphous silicon layer 140 is formed on the first polysilicon layer 120. For example, the amorphous silicon layer 140 may be formed with a thickness of about 1520 Å. In some embodiments, the first polysilicon layer 120 and the amorphous silicon layer 140 are formed in-situ. The first polysilicon layer 120 may be formed at a first temperature, and the amorphous silicon layer 140 may be formed at a second temperature lower than the first temperature. The first temperature may be equal to or higher than 580° C., such as 630° C., and the second temperature may be equal to or lower than 570° C., such as 530° C. Forming the first polysilicon layer 120 and the amorphous silicon layer 140 in-situ is beneficial for simplifying the process. Then, as shown in FIG. 4, a removing step may be conducted to remove unnecessary portions of the amorphous silicon layer 140. The removing step may comprise an etching step followed by a planarization step such as a chemical mechanical planarization (CMP) step. The remained portions of the amorphous silicon layer 140 may have a thickness of about 800 Å.

Figure 5:
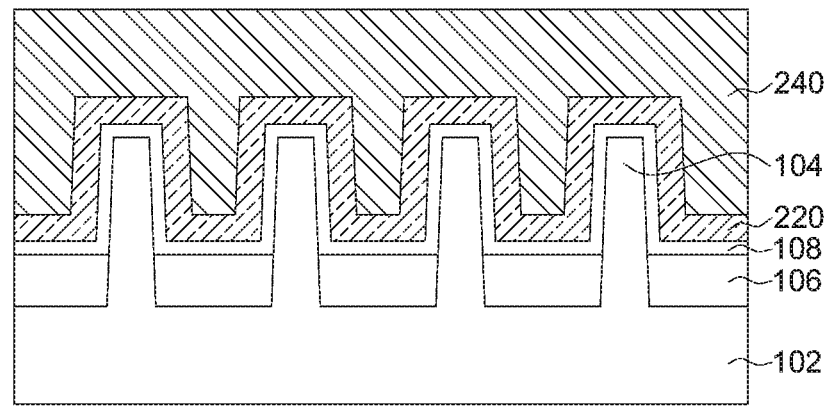

Referring to FIG. 5, a thermal process may be conducted. The thermal process may be an anneal process. The amorphous silicon layer 140 is transformed to a second polysilicon layer 240 by the thermal process. In addition, the first polysilicon layer 120 may also be transformed to a third polysilicon layer 220 by the thermal process, wherein a crystal plane composition of the third polysilicon layer 220 is different from a crystal plane composition of the first polysilicon layer 120. A crystal plane composition of the second polysilicon layer 240 is different from the crystal plane composition of the third polysilicon layer 220. In particular, a (1,1,1)/(2,2,0) crystal plane ratio of the third polysilicon layer 220 may be lower than a (1,1,1)/(2,2,0) crystal plane ratio of the second polysilicon layer 240.

Figure 6:
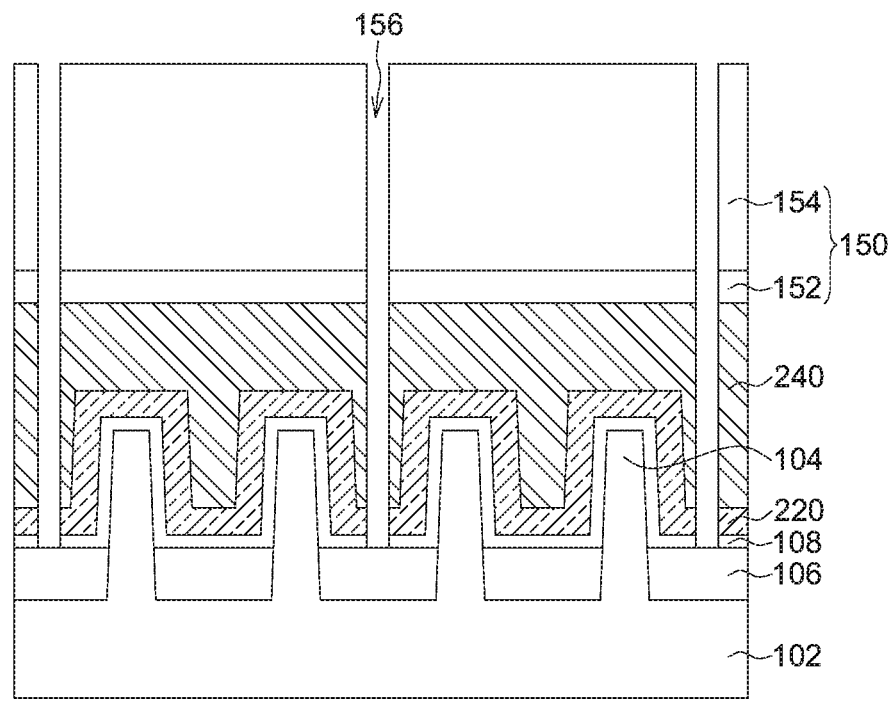
Figure 7A:
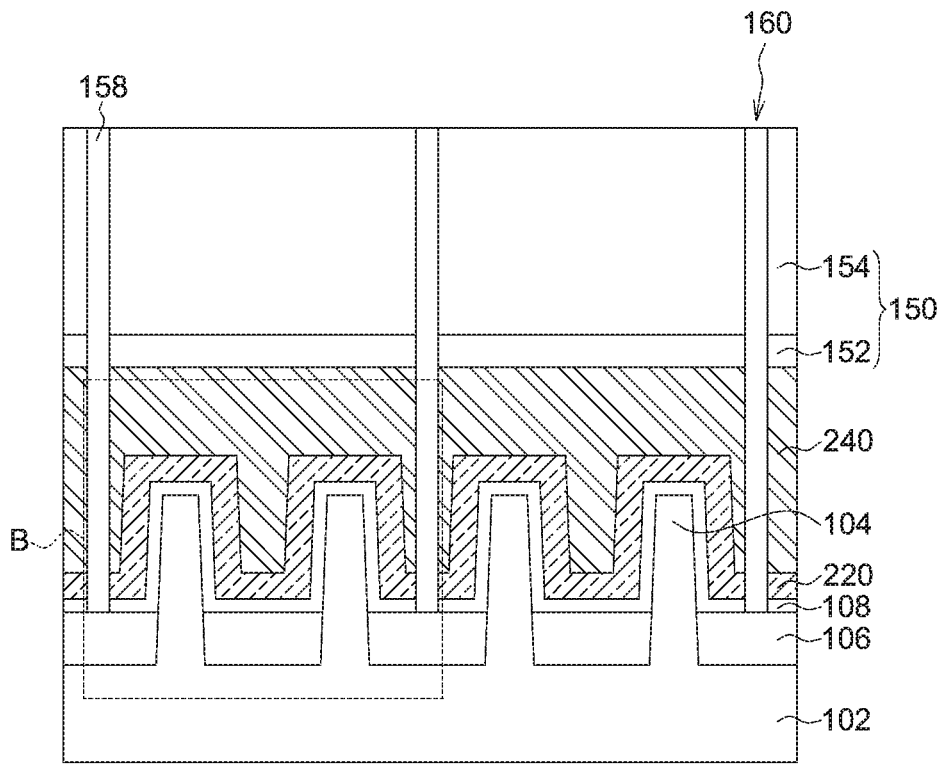
Figure 7B:
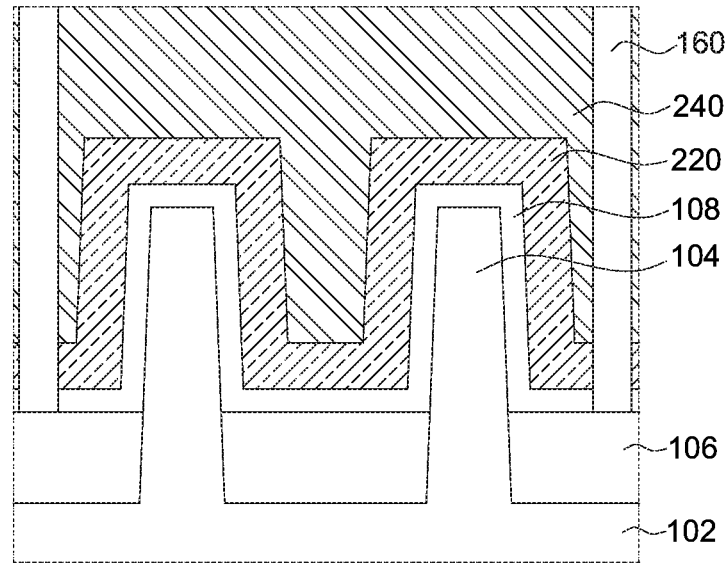

According to some embodiments, isolation structures 160 may be formed between groups of the fins 104. For example, each group may comprise two fins 104. Referring to FIG. 6, a hard mask layer 150 is formed on the second polysilicon layer 240. For example, the hard mask layer 150 may comprise a silicon nitride layer 152 and an oxide layer 154. Slots 156 are formed penetrating the second polysilicon layer 240 and the third polysilicon layer 220. According to some embodiments, an implantation step for source and drain may be conducted. According to some embodiments, an epitaxy step for forming SiGe stressors may be conducted. A dielectric material 158 is filled into the slots 156, and thereby the isolation structures 160 are formed, as shown in FIGS. 7A-7B, wherein FIG. 7B is an enlarged diagram of the portion B in FIG. 7A. An optional CMP step may be conducted to remove the unnecessary dielectric material 158.

Figure 8:
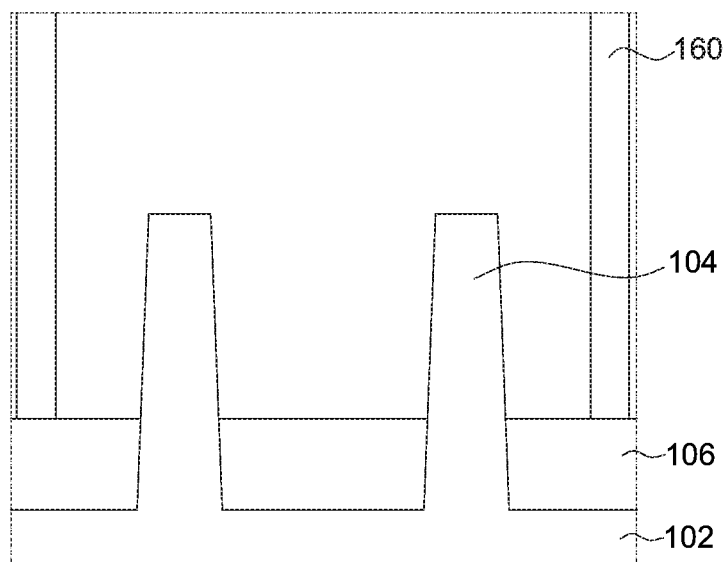

Then, the second polysilicon layer 240 and the third polysilicon layer 220 may be removed, as shown in FIG. 8. The second polysilicon layer 240 and the third polysilicon layer 220 may be removed for various reasons, such as for a replacement metal gate process. According to some embodiments, the second polysilicon layer 240 and the third polysilicon layer 220 may be removed using at least one etchant. The at least one etchant comprises $NH_4OH$. For example, dilute hydrofluoric acid (dHF) and $NH_4OH$ may be used as the etchant. According to some embodiments, the second polysilicon layer 240 and the third polysilicon layer 220 may be removed by a dry etch step followed by a wet etch step. In the dry etch step, $NF_3$ and $Cl_2$ may be used as etchants. In the wet etch step, dHF and $NH_4OH$ may be used as etchants.

The third polysilicon layer 220 is easier to be removed than the third polysilicon layer 220 by an etchant, such as $NH_4OH$, due to the different crystal plane composition. For example, when $NH_4OH$ is used as the etchant to removing the silicon material, the (1,1,1) crystal plane may lead to an undesired residue because the (1,1,1) crystal plane may block the paths of the etchant to lower portions. Since the (1,1,1)/(2,2,0) crystal plane ratio of the third polysilicon layer 220 can be lower than the (1,1,1)/(2,2,0) crystal plane ratio of the second polysilicon layer 240, the third polysilicon layer 220 is easier to be removed, and thereby there can be no undesired residue after the removing step. In contrast, in the case that only the polysilicon layer transformed from the amorphous silicon layer is formed, a residue of even up to 300 Å thick may be remained in the semiconductor structure, such as between a fin and an isolation structure. It can be understood that the formation of an additional polysilicon layer will not lead to an unbearable burden for the fabrication. The method described herein is compatible with the typical manufacturing processes.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A method for forming a semiconductor structure, comprising:
   providing a preliminary structure comprising a substrate and a plurality of fins formed on the substrate;
   forming a first polysilicon layer on the substrate, the first polysilicon layer covering at least portions of the fins;
   forming an amorphous silicon layer on the first polysilicon layer; and
   transforming the amorphous silicon layer to a second polysilicon layer by a thermal process, wherein the first polysilicon layer is transformed to a third polysilicon layer by the thermal process, and a crystal plane composition of the third polysilicon layer is different from a crystal plane composition of the first polysilicon layer.

2. The method according to claim 1, wherein the first polysilicon layer and the amorphous silicon layer are formed in-situ.

3. The method according to claim 2, wherein the first polysilicon layer is formed at a first temperature, and the amorphous silicon layer is formed at a second temperature lower than the first temperature.

4. The method according to claim 3, wherein the first temperature is equal to or higher than 580° C., and the second temperature is equal to or lower than 570° C.

5. The method according to claim 1, wherein the first polysilicon layer has a thickness of 300 Å to 600 Å.

6. The method according to claim 1, wherein a crystal plane composition of the second polysilicon layer is different from the crystal plane composition of the third polysilicon layer.

7. The method according to claim 1, wherein a (1,1,1)/(2,2,0) crystal plane ratio of the third polysilicon layer is lower than a (1,1,1)/(2,2,0) crystal plane ratio of the second polysilicon layer.

8. The method according to claim 1, wherein the thermal process is an anneal process.

9. The method according to claim 1, further comprising:
   removing the second polysilicon layer and the third polysilicon layer.

10. The method according to claim 9, wherein the second polysilicon layer and the third polysilicon layer are removed using at least one etchant.

11. The method according to claim 10, wherein the at least one etchant comprises $NH_4OH$.

12. The method according to claim 1, further comprising:
    forming isolation structures between groups of the fins, comprising:
       forming slots penetrating the second polysilicon layer and the third polysilicon layer; and
       filling a dielectric material into the slots.

13. The method according to claim 12, further comprising:
    after forming the isolation structures, removing the second polysilicon layer and the third polysilicon layer.

* * * * *